(12) United States Patent
New et al.

(10) Patent No.: US 6,292,019 B1
(45) Date of Patent: Sep. 18, 2001

(54) PROGRAMMABLE LOGIC DEVICE HAVING CONFIGURABLE LOGIC BLOCKS WITH USER-ACCESSIBLE INPUT MULTIPLEXERS

(75) Inventors: Bernard J. New; Richard A. Carberry, both of Los Gatos, CA (US)

(73) Assignee: Xilinx Inc., San Jose, CA (US)

( * ) Notice: Subject to any disclaimer, the term of this patent is extended or adjusted under 35 U.S.C. 154(b) by 0 days.

(21) Appl. No.: 09/505,579

(22) Filed: Feb. 16, 2000

Related U.S. Application Data

(60) Provisional application No. 60/133,064, filed on May 7, 1999.

(51) Int. Cl.$^7$ .................................................. H03K 19/177
(52) U.S. Cl. .................................. 326/41; 326/38; 326/40
(58) Field of Search ............................................ 326/37–41

(56) References Cited

U.S. PATENT DOCUMENTS

| | | | |
|---|---|---|---|
| 5,386,156 | * | 1/1995 | Britton et al. ........................... 326/37 |
| 5,905,385 | * | 5/1999 | Sharpe-Geisler ........................ 326/39 |
| 6,020,756 | | 2/2000 | New ........................................ 326/39 |
| 6,118,298 | * | 9/2000 | Bauer et al. ............................. 326/39 |
| 6,191,610 | * | 2/2001 | Wittig et al. ............................ 326/38 |

OTHER PUBLICATIONS

"The Programmable Logic Data Book", (1998) available from Xilinx, Inc., 2100 Logic Drive, San Jose, California 95124, pp. 4–5 to 4–40.

* cited by examiner

*Primary Examiner*—Michael Tokar
*Assistant Examiner*—Don Phu Le
(74) *Attorney, Agent, or Firm*—Arthur J. Behiel; Lois D. Cartier

(57) ABSTRACT

A programmable logic device (PLD) includes at least one function generator capable of implementing any arbitrarily defined Boolean function of input signals. The PLD includes a dynamically controlled multiplexer (MUX) on each function-generator input terminal. The inputs of each MUX can be routed to the corresponding function-generator input terminal by providing an appropriate select signal on one or more control lines. One embodiment of the PLD includes a programmable look-up table (LUT) that permits routing software to determine the correspondence between the MUX input terminals and a user-defined selection code on the MUX select lines. In one embodiment, the correspondence between the NUX input terminals and the selection code is established by configuring a number of programmable memory cells in the LUT. Another embodiment enhances programming flexibility with an additional MUX connected between the control lines and the LUT. This control MUX allows a user to determine which control lines will provide input signals to the function generator.

15 Claims, 5 Drawing Sheets

PROGRAMMABLE LOGIC DEVICE HAVING CONFIGURABLE LOGIC BLOCKS WITH USER-ACCESSIBLE INPUT MULTIPLEXERS

RELATED APPLICATION

This application completes provisional application Ser. No. 60/133,064 which was filed on May 7, 1999.

FIELD OF THE INVENTION

This invention relates generally to programmable logic devices, and in particular to a configurable logic block with improved programming flexibility.

BACKGROUND

Programmable logic devices (PLDS) are a well-known type of digital integrated circuit that may be programmed by a user (e.g., a logic designer) to perform specified logic functions. PLDs are becoming ever more popular, largely because they require less time to implement than semi-custom and custom integrated circuits.

FIG. 1 is a block diagram of one type of PLD, a field-programmable gate array (FPGA) 10. FPGA 10 includes an array of configurable logic blocks (CLBs) 20 that are programmably interconnected to each other and to programmable input/output blocks (IOBs) 30. The interconnections are provided by configurable horizontal and vertical interconnect lines 40 and 50, which may be connected to one another using programmable interconnect points (PIPs). This collection of configurable elements may be customized by loading configuration data into internal configuration memory cells (not shown) that define how the CLBs, PIPs, and IOBs are configured. The configuration data may be read from memory (e.g., an external PROM) or written into FPGA 10 from an external device. The collective states of the individual memory cells then determine the function of FPGA 10.

Logic designers commonly use multiplexers, or "MUXs," to dynamically select from among a number of signal sources. Consequently, conventional FPGAs provide dynamic multiplexing functions. In this context, "dynamic" means that the MUXs can be controlled during operation. This is in contrast to many other MUXs in conventional FPGAs that are statically controlled by configuration memory cells.

One type of FPGA allows logic designers to define dynamically controlled MUXs using look-up-table (LUT) based function generators. Such implementations are inefficient, however, because MUXs are simple, input-intensive devices, whereas LUT-based function generators are better suited for performing complex logic functions of a few inputs. For more information regarding conventional FPGAs that include configurable LUT-based function generators, see "The Programmable Logic Data Book," (1998) pp. 4-5 to 4-40, available from Xilinx, Inc., of San Jose, Calif., which is incorporated herein by reference.

FIG. 2A schematically depicts a conventional CLB 20 and eight associated input terminals 110A–H. CLB 20 includes a pair of LUT-based function generators 120 and 130, each of which connects to four of input terminals 110A–H. Each of input terminals 110A–H is programmably connectable to any of sixteen vertical interconnect lines, e.g., 140A and 140P. For example, input terminal 110A can be programmed to connect with vertical interconnect line 140A by programming a PIP 145. The PIPS, the input terminals, and the vertical interconnect lines collectively form a sixteen-input MUX for routing desired signals to function-generators 120 and 130. The terms "horizontal" and "vertical" are illustrative and not limiting.

Function generators 120 and 130, with outputs labeled F and G, are each capable of implementing any arbitrarily defined Boolean function of up to four inputs. A third LUT-based function generator 135 can implement any Boolean function of up to three inputs.

CLB 20 includes four statically controlled MUXs 146A–D that map four dynamic control inputs C1–C4 from outside CLB 20 into four internal control signals H1, H2, H0, and EC. Any of control inputs C1–C4 can drive any of the four internal control signals. Two additional statically controlled MUXs 148A and 148B select between function-generator outputs F and G and internal control signals H1 and H2 for input to function generator 135. The signal H0 on a third input of function generator 135 comes from a signal source external to CLB 20.

The MUXs and function generators of CLB 20 are some of the components included in a conventional CLB of the type found in the XC4000 family of FPGAs available from Xilinx, Inc. The remaining components of CLB 20 are lumped together in FIG. 2A as circuit 150 for ease of illustration. The operational details of CLB 20 are well understood and are therefore omitted for brevity.

FIG. 2B is a schematic diagram that includes CLE 20 of FIG. 2A connected to a two-level, sixteen-input MUX 160. MUX 160 schematically represents the functionality of input terminal 110A and associated PIPs and vertical interconnect lines.

MUX 160 includes five four-input MUXs 160A–E, each of which is controlled by a pair of programmable memory cells (not shown). FIG. 2B only depicts a single MUX 160 to function generator 120 for ease of illustration; it is to be understood, however, that similar MUXs are provided for each input terminal 110A–H of function generators 120 and 130.

Each of function generators 120 and 130 can implement a two-input MUX. In such a configuration, function generator 120, for example, is programmed to include a select input and a pair of MUX input terminals. The select and MUX input terminals are chosen from among input terminals 110A–D such that the logic level on the input terminal representing the select input selects between the signals present two other ones of input terminals 110A–D. Function generator 135 is also capable of implementing a two-input MUX that can select from F and G outputs of function generators 120 and 130.

CLB 20 can implement a two-level, four-input MUX by programming each of function generators 120, 130, and 135 to implement two-input MUXs. Unfortunately, implementing such a simple function in LUT-based function generators leaves many gates unused, gates that might otherwise be used to perform other functions. This is an inefficient use of CLB 20. There is therefore a need for a programmable logic device in which the CLBs are equally capable of implementing complex logic functions of few inputs and simple logic functions of many inputs.

SUMMARY

The present invention is directed to a programmable logic device (PLD) that can efficiently implement both complex logic functions of few inputs and simple logic functions of many inputs. As with conventional devices, the inventive PLD includes at least one function generator capable of implementing any arbitrarily defined Boolean function of signals presented on a plurality of function-generator input terminals. Unlike conventional devices, however, the inventive PLD includes a dynamically controlled MUX on each function-generator input terminal. Signals on the input terminals of each MUX can be routed to the corresponding function-generator input terminal by providing an appropriate select signal on one or more control lines. The combination of the function generator and dynamically controlled MUXs provides the same functionality as conventional logic devices while improving the efficiency with which the inventive PLD implements multiplexing functions that require a large number of inputs.

The dynamic MUX configuration can reduce the available routing resources for each function-generator input terminal. To mitigate this, one embodiment includes a programmable look-up table, or "LUT," that permits routing software to determine the correspondence between the MUX input terminals and a user-defined selection code on the MUX control lines. In one embodiment, the correspondence between the MUX input terminals and the selection code is established by configuring a number of programmable memory cells in the LUT. In another embodiment, the programming flexibility is further enhanced by an additional MUX connected between the control lines and the LUT. This control MUX allows a user to determine which control lines will provide select signals to the first MUX.

DETAILED DESCRIPTION

Figure 2A:
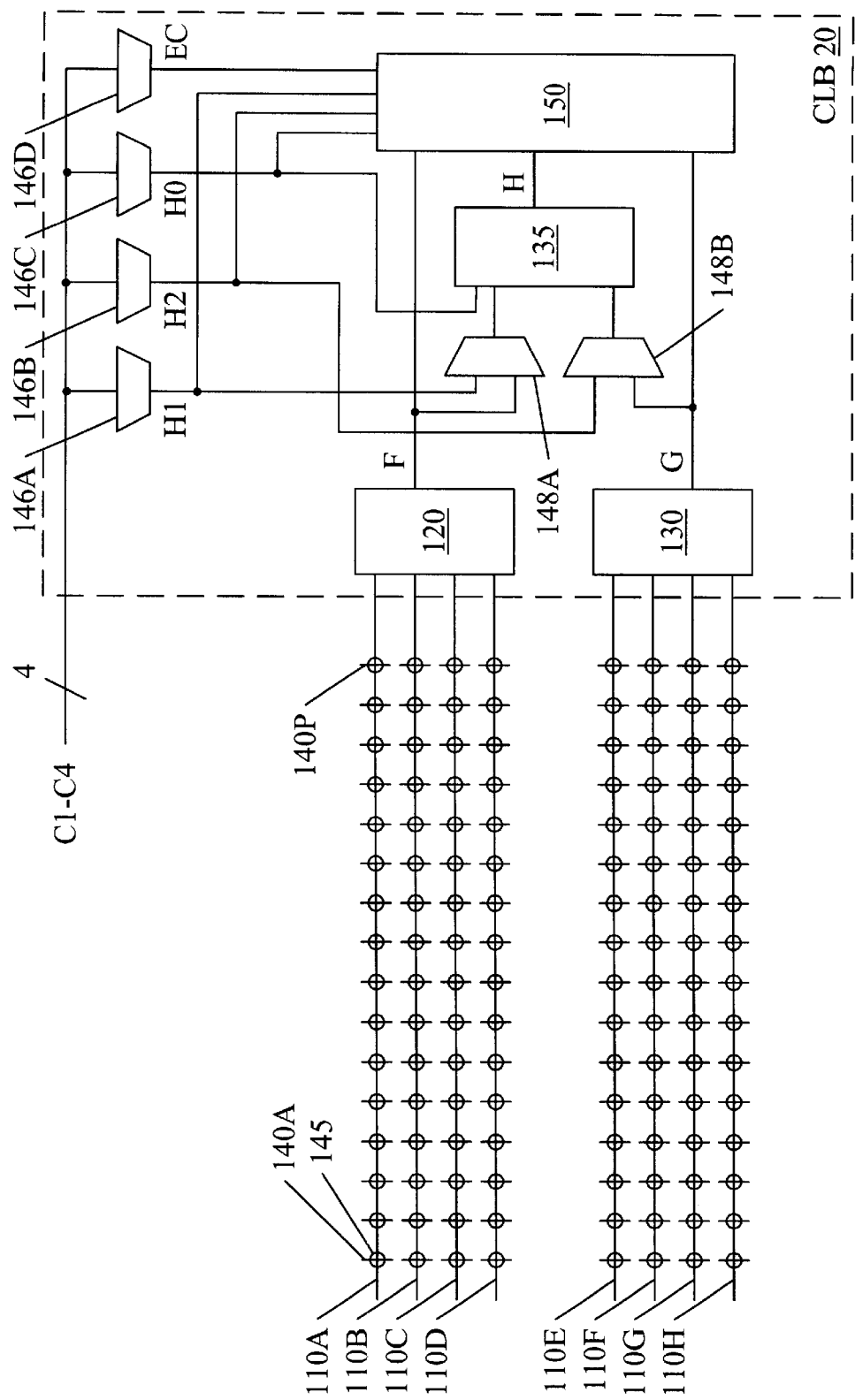
FIG. 2A schematically depicts a conventional CLB 20 and eight associated input terminals 110–H.
Figure 2B:
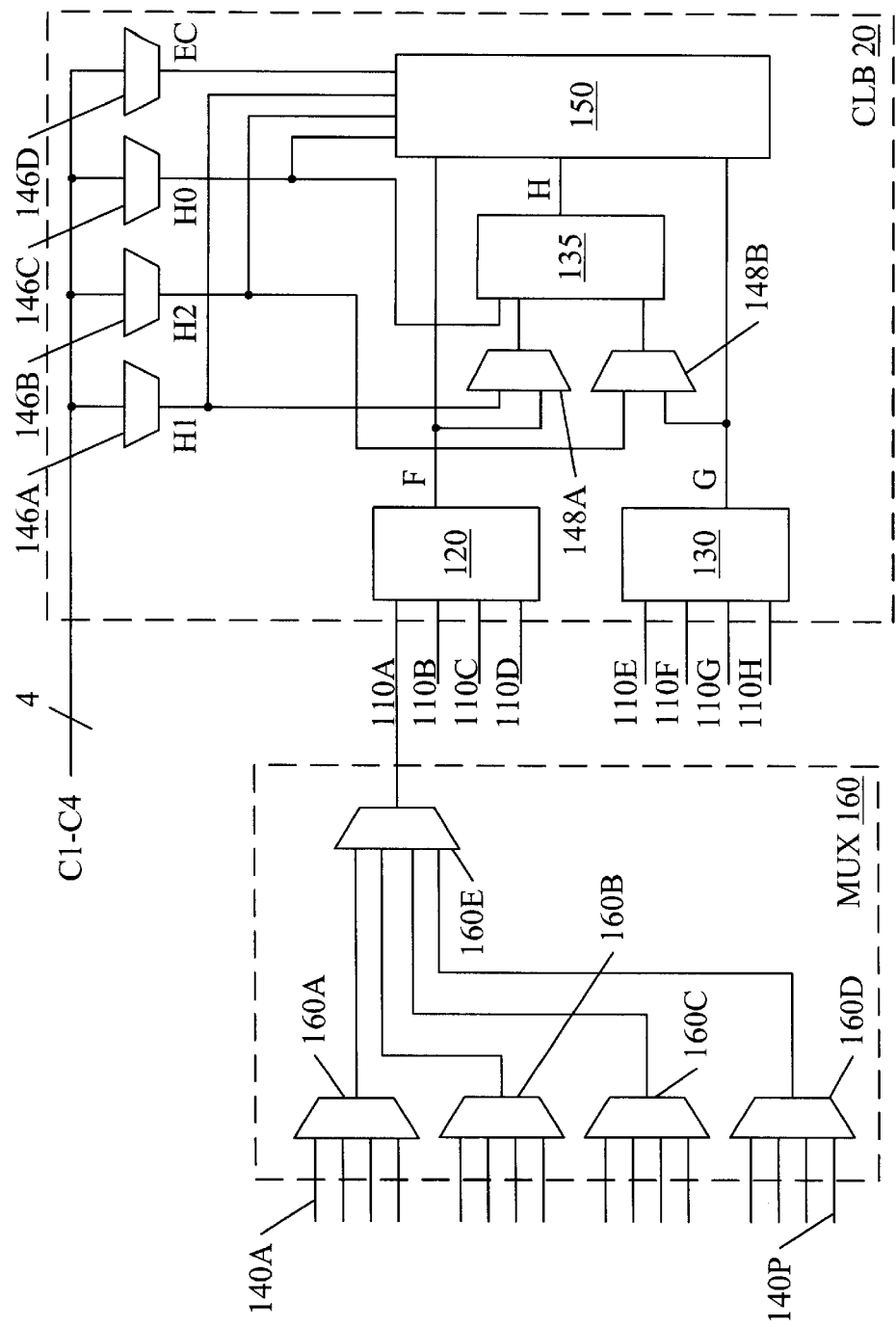
FIG. 2B schematically depicts conventional CLB 20 of FIG. 1 connected to a two-level, sixteen-input MUX 160.
Figure 3:
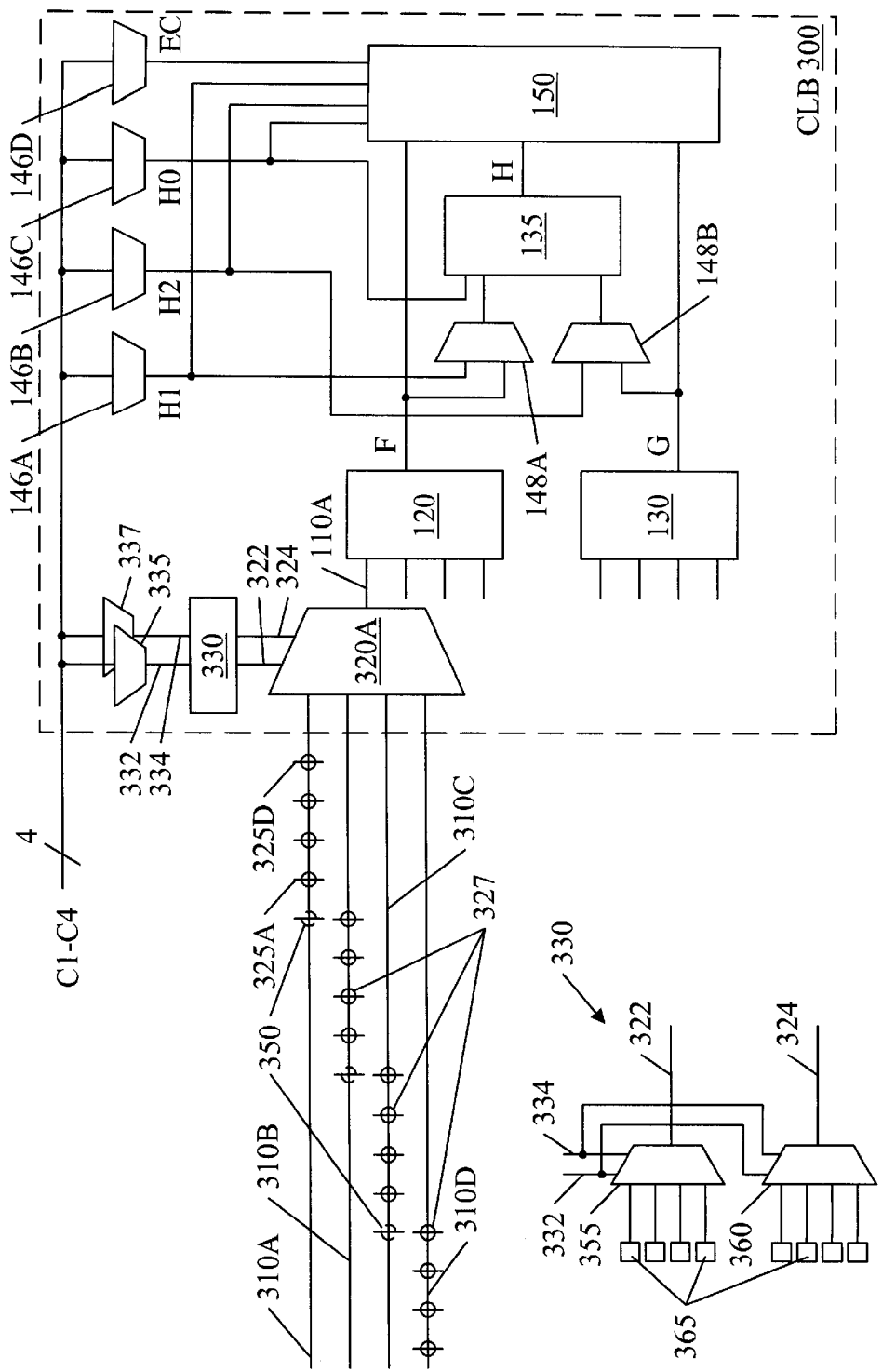
FIG. 3 schematically depicts a CLB 300 and associated interconnect circuitry configured in accordance with the present invention.

FIG. 3 schematically depicts a CLB 300 and associated interconnect circuitry configured in accordance with the present invention. Many elements of CLB 300 are the same as those of CLB 20 of FIGS. 1 and 2, like-numbered elements being identical. Four input terminals 310A–D connect to CLB 300 via a four-input MUX 320A. Each of input terminals 310A–D can be selectively connected to one of four vertical interconnect lines (e.g., interconnect lines 325A and 325D) by programming appropriate ones of PIPs 327.

The boundary of CLB 300, as compared with conventional CLB 20, is moved to encompass MUX 320A. FIG. 3 depicts a single MUX 320A connected to input terminal 110A of function generator 120; it is to be understood, however, that similar MUXs are provided for each input terminal of function generators 120 and 130. Those additional MUXs are omitted here for ease of illustration.

Figure 1:
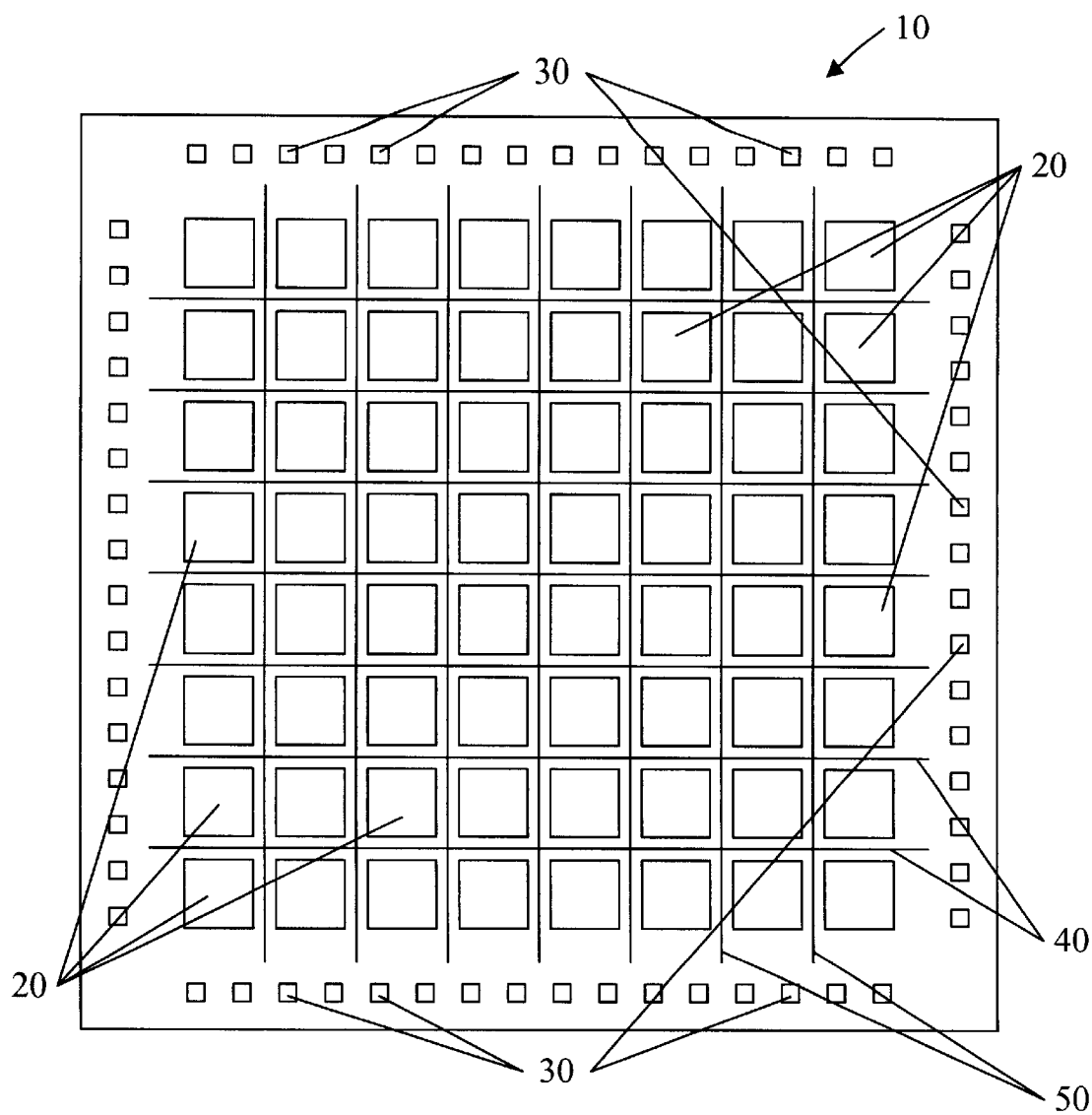
FIG. 1 is a block diagram of a field-programmable gate array 10.

MUX 320A is much like MUX 160E of FIG. 2, except that MUX 320A includes select inputs 322 and 324 that are adapted to receive dynamic input signals from a signal source external to CLB 320A. In the example of FIG. 1, these externally supplied select signals are chosen from among the conventional control inputs C1–C4 using a pair of four-input, statically controlled MUXs 335 and 337. Dedicated control inputs are provided in other embodiments. Including MUX 320A within the boundary of CLB 300 quadruples the effective number of function-generator inputs: input terminal 110A of function generator 120 can be dynamically selected from among the four input terminals 310A–D.

MUX 320A and seven similar MUXs (not shown) connected to the remaining seven input terminals 110B–H can each implement a four-input MUX. Each of function generators 120 and 130 can, in turn, multiplex the outputs of two MUXs, for a total of eight input terminals. Function generator 130 can similarly implement an eight-input MUX. Finally, function generator 135 can multiplex the respective F and G output terminals of function generators 120 and 130, thereby implementing a sixteen-input MUX using CLB 300.

Figure 4:
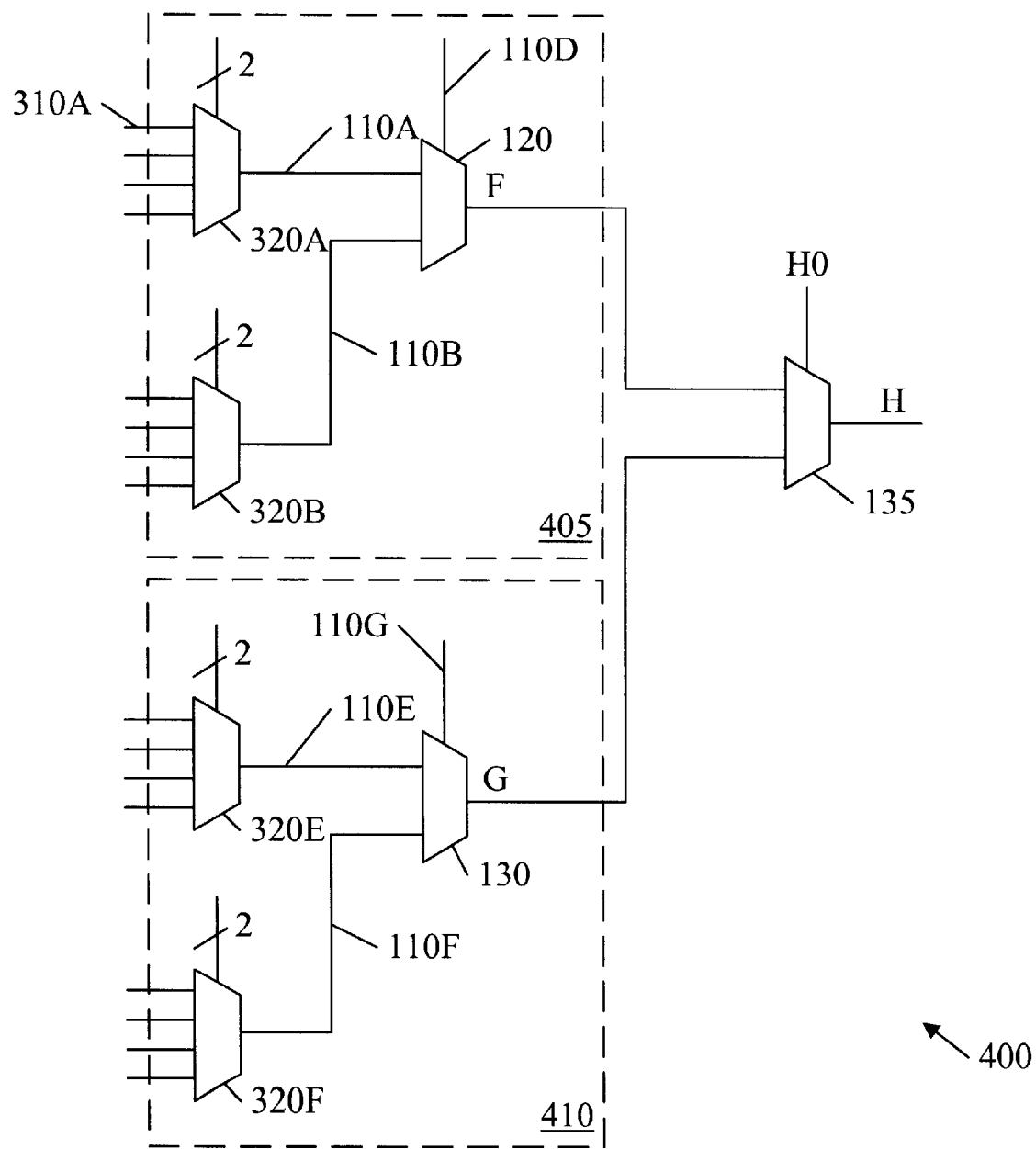
FIG. 4 depicts a sixteen-input MUX 400 implemented by programming CLB 300.

FIG. 4 depicts a 16-bit MUX 400 implemented using function generators 120, 130, and 135 of FIG. 3. Function generators 120, 130, and 135 are depicted as a MUXs to illustrate their configuration. For example, function generator 120 is configured to multiplex the output signals from four-input MUX 320A and a second four-input MUX 320B. Function generator 120 and MUXs 320A and 320B combined form an eight-input multiplexer 405. Although there are two remaining input MUXs similar to MUXs 320A and 320B on input terminals 110C and 110D, only two input terminals (e.g., 110A and 110B) are employed at a time because one input terminal of function generator 120 (e.g., 110D) is set aside as a select input, and a single binary select input can only select between two input signals. Function generator 130 and associated circuitry is similarly configured as an eight-input MUX 410.

The F and G outputs of respective function generators 120 and 130 connect to input terminals of function generator 135. As with function generators 120 and 130, function generator 135 is depicted as a two-input MUX to reflect its configuration. Thus configured, CLB 300 is a dynamic, sixteen-input MUX. This represents a four-fold increase in the number of input signals that may be dynamically multiplexed as compared with CLB 20 of FIG. 2A. Of course, not all of the resources available within CLB 300 need be used to implement multiplexers for CLB 300 to realize the advantages associated with the invention. For example, function generator 120 and associated MUXs can implement an eight-input MUX, conserving the remaining resources within CLB 300 for other functions. Myriad other configurations are possible, as will be understood by those of skill in the art.

Returning to FIG. 3, CLB 300 includes four times the effective number of function-generator input terminals than the conventional CLB 20 of FIGS. 2A and 2B. However, this increase causes a corresponding decrease in the number of vertical interconnect lines available to each function-generator. This decrease renders the FPGA more difficult to route. To mitigate this, one embodiment includes a LUT 330 having input terminals 332 and 334 connected to control lines C1–C4 and output terminals 322 and 324 of MUX 320A. LUTs similar to LUT 330 are likewise provided to the remaining MUXs associated with input terminals 110–H.

LUT 330 permits the FPGA routing software to determine the correspondence between the MUX inputs (e.g., input terminals 310A–D) and a user-defined selection code. LUT 330 can then be configured to provide the input signals on input terminals 310A–D to input terminal 110A in any order. Other embodiments achieve additional flexibility by including additional PIPs 350 (dashed circles) that overlap with PIPs associated with other of input terminals 310A–D. CLB 300 is easily configured to function as conventional CLB 20. If MUX 320A is not needed, LUT 330 is simply programmed to statically provide a desired output to MUX 320A independent of the selection control on terminals 332 and 334.

The lower, left-hand corner of FIG. 3 includes a schematic diagram of an embodiment of LUT 330. That embodiment includes a pair of four-input MUXs 355 and 360, each having input terminals connected to configuration memory cells 365. The two select lines 332 and 334 for each of MUxs 355 and 360 connect in parallel to respective MUXs 335 and 337. Output terminals 322 and 324 connect to the select terminals of MUX 320A. Configuration memory cells 365 are programmed with the desired selection codes to map the control signals on lines 332 and 334 to select inputs 322 and 324.

CLB 300 offers numerous advantageous over conventional CLBs. For example, many circuit configurations require fewer CLBs because the logic used to implement them is moved out of function generators and into dedicated resources. Moreover, CLB 300 increases speed performance and reduces power consumption because the dedicated MUX resources are faster than CLBs and because fewer intermediate signals need be routed between CLBs on capacitive interconnect lines.

While the present invention has been described in connection with specific embodiments, variations of these embodiments will be obvious to those of ordinary skill in the art. For example, application of the invention is not limited to the above-described FPGA architecture. Another acceptable architecture is described in the U.S. Pat. No. 6,020,756, issued Feb.1, 2000, entitled "Multiplexer Enhanced Configurable Logic Block," by Bernard J. New, which is incorporated herein by reference. Moreover, some components are shown directly connected to one another while others are shown connected via intermediate components. In each instance, the method of interconnection establishes some desired electrical communication between two or more circuit nodes, or terminals. Such communication may often be accomplished using a number of circuit configurations, as will be understood by those of skill in the art. Therefore, the spirit and scope of the appended claims should not be limited to the foregoing description.

What is claimed is:

1. A configurable logic block on an integrated circuit, wherein the integrated circuit includes a signal source external to the configurable logic block, the configurable logic block comprising:

a function generator having first and second input terminals;

a first multiplexer having a plurality of input terminals, a select terminal, and a first multiplexer output terminal, wherein the first multiplexer output terminal is connected to the first input terminal of the function generator;

a second multiplexer having a plurality of input terminals, a select terminal, and a second multiplexer output terminal, wherein the second multiplexer output terminal is connected to the second input terminal of the function generator;

a first control terminal connected to the select terminal of the first multiplexer;

a second control terminal connected to the select terminal of the second multiplexer; and a look-up table having:

a. an input terminal connected to the first control terminal; and b. an output terminal connected to the select terminal of the first multiplexer, wherein the first and second control terminals are adapted to receive input signals from the signal source external to the configurable logic block.

2. A configurable logic block on an integrated circuit, wherein the integrated circuit includes a signal source external to the configurable logic block, the configurable logic block comprising:

a function generator having first and second input terminals;

a first multiplexer having a plurality of input terminals, a select terminal, and a first multiplexer output terminal, wherein the first multiplexer output terminal is connected to the first input terminal of the function generator;

a second multiplexer having a plurality of input terminals, a select terminal, and a second multiplexer output terminal, wherein the second multiplexer output terminal is connected to the second input terminal of the function generator;

a first control terminal connected to the select terminal of the first multiplexer;

a second control terminal connected to the select terminal of the second multiplexer; and a third multiplexer having an input terminal connected to the first control terminal and an output terminal connected to the select terminal of the first-mentioned multiplexer, wherein the first and second control terminals are adapted to receive input signals from the signal source external to the configurable logic block.

3. A configurable logic block on an integrated circuit, wherein the integrated circuit includes a signal source external to the configurable logic block, the configurable logic block comprising:

a. a function generator having first and second input terminals;

b. a first multiplexer having a plurality of input terminals, a select terminal, and a first multiplexer output terminal, wherein the first multiplexer output terminal is connected to the first input terminal of the function generator;

c. a second multiplexer having a plurality of input terminals, a select terminal, and a second multiplexer output terminal, wherein the second multiplexer output terminal is connected to the second input terminal of the function generator;

d. a first control terminal connected to the select terminal of the first multiplexer; and e. a second control terminal connected to the select terminal of the second multiplexer;

f. wherein the first and second control terminals are adapted to receive input signals from the signal source external to the configurable logic block.

4. The configurable logic block of claim 3, wherein the signal source is external to the integrated circuit.

5. A programmable logic device comprising:

a. a plurality of configurable logic blocks, each logic block including:

i. a function generator having first and second input terminals;

ii. a multiplexer having a plurality of input terminals, a select terminal, and a multiplexer output terminal, wherein the multiplexer output terminal is connected to the first input terminal of the function generator; and iii. a look-up table having:
(1) an output terminal connected to the select terminal of the multiplexer; and
(2) an input terminal adapted to receive a first input signal from a first signal source external to the configurable logic block; and b. a matrix of programmable interconnect lines separating ones of the configurable logic blocks, wherein the interconnect lines are configured to selectively interconnect ones of the configurable logic blocks via the plurality of input terminals of the multiplexer.

6. The programmable logic device of claim 5, wherein the look-up table comprises a plurality of programmable memory cells.

7. The programmable logic device of claim 5, wherein the look-up table comprises a second multiplexer having an output terminal connected to the input terminal of the look-up table.

8. The programmable logic device of claim 5, further comprising a second multiplexer having an input terminal configured to receive a second input signal from a second signal source and an output terminal connected to the input terminal of the look-up table.

9. The programmable logic device of claim 5, wherein the first signal source is external to the programmable logic device.

10. A programmable logic device comprising:

a plurality of configurable logic blocks, each logic block including a function generator having a function-generator input terminal;

a matrix of programmable interconnect lines separating ones of the configurable logic blocks, wherein the interconnect lines are configured to selectively interconnect ones of the configurable logic blocks; and means for dynamically connecting selected ones of the interconnect lines to the function-generator input terminal, wherein the means for dynamically connecting selected ones of the interconnect lines to the function-generator input terminal comprises a look-up table.

11. A configurable logic block on an integrated circuit, the configurable logic block comprising:

a function generator having first and second input terminals;

a multiplexer having a plurality of input terminals, a select terminal, and a multiplexer output terminal, wherein the multiplexer output terminal is connected to the first input terminal of the function generator;

a control terminal connected to the select terminal, the control terminal adapted to receive an input signal from a signal source external to the CLB; and a look-up table having:
a. an input terminal connected to the control terminal; and
b. an output terminal connected to the select terminal of the multiplexer.

12. The configurable logic block of claim 11, wherein the signal source is external to the integrated circuit.

13. A configurable logic block on an integrated circuit, the configurable logic block comprising:

a function generator having first and second input terminals;

a multiplexer having a plurality of input terminals, a select terminal, and a multiplexer output terminal, wherein the multiplexer output terminal is connected to the first input terminal of the function generator;

a control terminal connected to the select terminal, the control terminal adapted to receive an input signal from a signal source external to the CLB; and a second multiplexer having an input terminal connected to the control terminal and an output terminal connected to the select terminal of the first-mentioned multiplexer.

14. A programmable logic device comprising:

a. a plurality of configurable logic blocks, each logic block including a function generator having a function-generator input terminal;

b. a matrix of programmable interconnect lines separating ones of the configurable logic blocks, wherein the interconnect lines are configured to selectively interconnect ones of the configurable logic blocks; and c. means for dynamically connecting selected ones of the interconnect lines to the function-generator input terminal.

15. The programmable logic device of claim 14, wherein the means for dynamically connecting selected ones of the interconnect lines to the function-generator input terminal comprises a multiplexer.

* * * * *